US012598824B2

(12) United States Patent
Chang et al.

(10) Patent No.: US 12,598,824 B2
(45) Date of Patent: Apr. 7, 2026

(54) CMOS IMAGE SENSOR WITH 3D MONOLITHIC OSFET AND FEMIM

(71) Applicant: Powerchip Semiconductor Manufacturing Corporation, Hsinchu (TW)

(72) Inventors: Shou-Zen Chang, Hsinchu City (TW); Ming-Han Liao, Hsinchu City (TW); Min-Cheng Chen, Hsinchu County (TW); Shang-Shiun Chuang, Taipei City (TW)

(73) Assignee: Powerchip Semiconductor Manufacturing Corporation, Hsinchu (TW)

( * ) Notice: Subject to any disclaimer, the term of this patent is extended or adjusted under 35 U.S.C. 154(b) by 476 days.

(21) Appl. No.: 18/134,025

(22) Filed: Apr. 12, 2023

(65) Prior Publication Data

US 2024/0047485 A1 Feb. 8, 2024

(30) Foreign Application Priority Data

Aug. 5, 2022 (TW) .................................. 111129590

(51) Int. Cl.
| | |
|---|---|
| *H10F 39/00* | (2025.01) |
| *H04N 25/771* | (2023.01) |
| *H04N 25/78* | (2023.01) |
| *H10F 39/18* | (2025.01) |

(52) U.S. Cl.
CPC ......... *H10F 39/802* (2025.01); *H04N 25/771* (2023.01); *H04N 25/78* (2023.01); *H10F 39/182* (2025.01); *H10F 39/8053* (2025.01); *H10F 39/8063* (2025.01); *H10F 39/811* (2025.01)

(58) Field of Classification Search
CPC .. H10F 39/802; H10F 39/182; H10F 39/8053; H10F 39/8063; H10F 39/811; H10F 39/18; H10F 39/803; H10F 39/8037; H10F 39/809; H04N 25/11; H04N 25/79; H04N 25/771; H04N 25/78
See application file for complete search history.

(56) References Cited

U.S. PATENT DOCUMENTS

2020/0389608 A1* 12/2020 Baek .................... H04N 25/778

FOREIGN PATENT DOCUMENTS

| | | | | |
|---|---|---|---|---|
| CN | 110572593 A | * | 12/2019 | ............. H04N 25/79 |
| TW | 201820601 A | | 6/2018 | |
| TW | 202029443 A | | 8/2020 | |
| TW | 202114192 A | | 4/2021 | |

\* cited by examiner

*Primary Examiner* — William B Partridge
*Assistant Examiner* — Chevy J Boegel
(74) *Attorney, Agent, or Firm* — Winston Hsu

(57) ABSTRACT

A CMOS image sensor with 3D monolithic OSFET and FEMIM capacitor, including a substrate with CMOS devices formed thereon, a BEOL interconnect layer on the substrate and with BEOL interconnects formed therein, a pixel circuit layer on the BEOL interconnect layer. The OSFETs and FEMIM capacitors are formed in the pixel circuit layer, and a photoelectric conversion layer on the pixel circuit layer and with photodiodes are formed therein, wherein the CMOS devices, the OSFETs, FEMIM capacitors and photodiodes are electrically connected with each other through the BEOL interconnects.

4 Claims, 1 Drawing Sheet

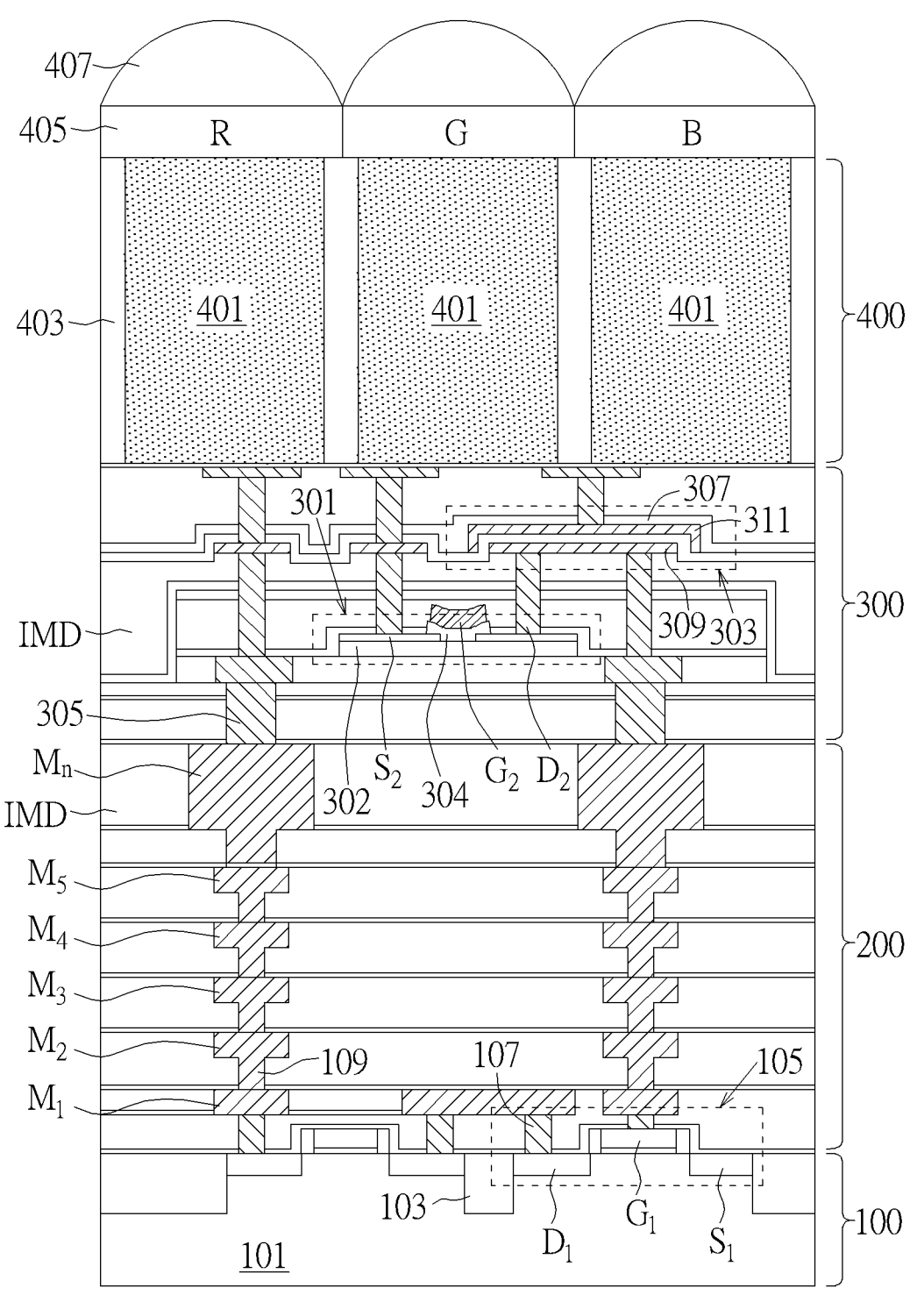

CMOS IMAGE SENSOR WITH 3D MONOLITHIC OSFET AND FEMIM

BACKGROUND OF THE INVENTION

1. Field of the Invention

The present invention relates generally to a complementary metal-oxide-semiconductor image sensor (CMOS image sensor, CIS), and more specifically, to a CMOS image sensor with 3D monolithic oxide-semiconductor field effect transistor (OSFET) and ferroelectric metal-insulator-metal (FEMIM) capacitor.

2. Description of the Prior Art

Electronic equipment having semiconductor devices are essential for many modern applications. Solid-state (e.g. semiconductor) image sensors are commonly involved in electronic equipment used for sensing light, wherein complementary metal-oxide-semiconductor image sensors (CIS, which referred hereinafter as CMOS image sensor) are widely used in various applications and fields, such as digital camera and mobile phone cameras. CMOS image sensor typically includes an array of picture elements (pixels). Each pixel includes transistors, capacitors and photodiodes, wherein electrical energy is induced in the photodiode upon exposure to the luminous environment. Each pixel generates electrons proportional to an amount of light entering the pixel. The electrons are converted into a voltage signal in the pixel and are further transformed into digital signal.

With the emergence of artificial intelligence (AI) in recent years, the accomplishing of various novel technologies are driven through AI, machine learning and deep learning in many technology fields. Since AI system and AI algorithm provide machines (ex. computer) with models capable of data processing, reasoning and deep learning, these AI systems and models are usually trained in high intensity to execute specific tasks, such as tasks like neuro-linguistic processing, image recognition, planning and making a decision. Accordingly, the concept of AIoT becomes popular, wherein digital devices are closely connected through well-developed, mature IoT technology, cooperating with AI to learn the received external data or information to make predictive analytics, decision or judgement, thereby implementing the function like automation, remote control or serially connecting to other devices, which may bring about more innovative and convenient applications in industry field like traffic, medical, manufacturing or even in daily life in the future.

As an information receiving device, CMOS image sensor plays an important role in the application of AIoT. Traditional electronic monitor needs to transfer the received image files to the cloud through network resource for analyzing and processing purposes, wherein the transferred quantity of data may be easily over gigabyte (GB, one billion bytes). Data traffic and power consumption would be the serious obstacles of this application. In response to this situation, the design of AI CIS (artificial intelligence CMOS image sensor) is provided in the industry, with features of setting edge AI devices at the stage of CMOS image sensor to process image data instead of cloud AI. In this way, the data to be transferred after process will be text files with sizes merely byte level to kilobyte (KB) level, and power consumption in overall process may be nearly one out of a thousand of the one of conventional cloud AI approach. The problem of power consumption in the sensor and network bottleneck may be solved once and for all.

Nevertheless, there are still many disadvantages in AI CIS technology to be improved. For example, AI CIS device require components like highly-integrated CMOS image sensor, memory, pixel circuit, and logic circuit. Current approach in the industry is to integrate these components of different levels through 3D package and wafer-level bonding. This method may involve several wafer bonding processes, thus additional through silicon via (TSV) process and wafer alignment steps are required and may easily suffer reliability issue due to extra complicated package process. In addition, total thickness of the device will be too large if multiple heterogeneous substrates are stacked and integrated together, which is not good for the miniaturization purpose of the mobile or wearable electronic devices nowadays. Furthermore, conventional approach usually adopts DRAM to serve as the storage unit of AI CIS, wherein its data and information need to be transmitted and refreshed repeatedly between computing unit and memory. This scheme limits overall efficiency and process time and cannot fulfill instant application in the actual situation, which may result in high-level power consumption.

SUMMARY OF THE INVENTION

In the light of the aforementioned disadvantages of current conventional skill, the present invention hereby provides a novel CMOS image sensor, with feature of adopting 3D monolithic method to manufacture oxide-semiconductor field effect transistors (OSFETs) and ferroelectric metal-insulator-metal (FEMIM) capacitors as ferroelectric random access memory (FeRAM) directly on BEOL metal layers of the CMOS image sensor, without complicated package steps like wafer bonding and manufacturing TSVs, and is more suitable for the advanced applications with artificial intelligence CMOS image sensor (AI CIS) and in-memory computing.

The objective of present invention is to provide a CMOS image sensor with 3D monolithic OSFET and FEMIM capacitor, including a substrate with CMOS field effect transistors formed thereon, a BEOL interconnect layer on the substrate, and BEOL interconnects are formed in the BEOL interconnect layer, a pixel circuit layer on the BEOL interconnect layer, wherein OSFETs and FEMIM capacitors are formed in the pixel circuit layer, and a photoelectric conversion layer on the pixel circuit layer, wherein photodiodes is provided in the photoelectric conversion layer, wherein the CMOS field effect transistors, the OSFETs, the FEMIM capacitors and the photodiodes are electrically connected with each other through the BEOL interconnect layer.

These and other objectives of the present invention will no doubt become obvious to those of ordinary skill in the art after reading the following detailed description of the preferred embodiment that is illustrated in the various FIGURES and drawings.

BRIEF DESCRIPTION OF THE DRAWINGS

FIG. 1 is a schematic cross-sectional view illustrating a CMOS image sensor with 3D monolithic architecture in accordance with the preferred embodiment of present invention.

It should be noted that all the figures are diagrammatic. Relative dimensions and proportions of parts of the drawings have been shown exaggerated or reduced in size, for the sake of clarity and convenience in the drawings. The same reference signs are generally used to refer to corresponding or similar features in modified and different embodiments.

DETAILED DESCRIPTION

Reference will now be made in detail to exemplary embodiments of the invention, which are illustrated in the accompanying drawings in order to understand and implement the present disclosure and to realize the technical effect. It can be understood that the following description has been made only by way of example, but not to limit the present disclosure. Various embodiments of the present disclosure and various features in the embodiments that are not conflicted with each other can be combined and rearranged in various ways. Without departing from the spirit and scope of the present disclosure, modifications, equivalents, or improvements to the present disclosure are understandable to those skilled in the art and are intended to be encompassed within the scope of the present disclosure.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something). Further, spatially relative terms, such as "beneath," "below," "lower," "above," "upper," and the like, may be used herein for ease of description to describe one element or feature relationship to another element (s) or feature (s) as illustrated in the FIGURES.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon (Si), germanium (Ge), gallium arsenide (GaAs), indium phosphide (InP), etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure, or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which contacts, interconnect lines, and/or through holes are formed) and one or more dielectric layers.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. Additionally, the term "based on" may be understood as not necessarily intended to convey an exclusive set of factors, but may allow for the presence of other factors not necessarily expressly described, again depending at least in part on the context.

It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

The objective of present invention is to provide a 3D monolithic complementary metal-oxide-semiconductor image sensor (CMOS image sensor, CIS, which referred hereinafter as CMOS image sensor), with structures including metal-oxide-semiconductor field-effect transistor (MOSFET) and oxide-semiconductor field-effect transistor (OSFET) respectively in the pixel circuit and logic circuit of the CMOS image sensor, and further including a high capacitance ferroelectric metal-insulator-metal (FEMIM) capacitor as a storage node for the memory structure and is integrated on the same substrate in the same semiconductor process using 3D monolithic architecture.

Please refer first to FIG. 1, which is a schematic cross-sectional view illustrating a CMOS image sensor with 3D monolithic architecture in accordance with the preferred embodiment of present invention. The structures and components of CMOS image sensor of the present invention in a direction vertical to the substrate may be understood through this cross-sectional view. As shown in the FIGURE, the CMOS image sensor of present invention is generally composed of a silicon device layer 100, a back-end-of-line (BEOL) interconnect layer 200, a pixel circuit layer and a photoelectric conversion layer 400. Specifically, the silicon device layer 100 includes a substrate 101 as a base for setting whole memory structure. The substrate 101 may be any component with carrier function, for example a semiconductor substrate including Si-based substrate, silicon-on-insulator (SOI) substrate, sapphire substrate, etc., but not limited thereto. Silicon oxide based shallow trench isolation 103 is formed in the substrate 101 to define and isolate the active areas on the substrate 101. Metal-oxide-semiconductor field effect transistors (MOSFET) 105, ex. CMOS devices, are formed on the active area of substrate 101 to function as logic circuits or peripheral circuits of the CMOS image sensor. For example, in the embodiment of present invention, MOSFET 105 may function directly as a read transistor in analog-to-digital conversion (ADC) circuit to acquire analog storage state of the memory above. Generally, each MOSFET 105 corresponds to a memory unit and a pixel unit above. The MOSFET 105 is provided with structures like gate $G_1$, source $S_1$ and drain $D_1$, wherein source $S_1$ and drain $D_1$ are doped regions in substrate 101, which may be electrically connected to a first metal layer $M_1$ above in the BEOL interconnect layer 200 through contacts 107. Gate $G_1$ is between source $S_1$ and drain $D_1$, which its material may be polysilicon or metal to control channel switch between the source $S_1$ and drain $D_1$, and may also be electrically connected to the first metal layer $M_1$ through contacts 107.

Refer still to FIG. 1. BEOL interconnect layer 200 is formed on the silicon device layer, including multiple intermetal dielectric layers IMD, BEOL metal layers $M_1$-$M_n$ in the inter-metal dielectric layers IMD and vias 109. The BEOL metal layers $M_1$-$M_n$ are connected with each other through vias 109, and the BEOL metal layers $M_1$-$M_n$ and the vias 109 constitute BEOL interconnects. The BEOL metal layers $M_1$-$M_n$ and vias 109 may be formed in the inter-metal dielectric layers IMD through dual-damascene process, wherein the material of BEOL metal layers $M_1$-$M_n$ may be W, Cu or Al, etc. The material of vias 109 may be Cu, Al, Ti, W or Ta, etc. The material of inter-metal dielectric layer IMD may be silicon oxide based phosphor-silicate glass (PSG), boron-phosphor-silicate glass (BPSG) or low-k dielectrics, etc.

Refer still to FIG. 1. In the embodiment of present invention, a pixel circuit layer 300 is set on the BEOL interconnect layer 200. OSFET 301 and FEMIM capacitor 303 are provided in the pixel circuit layer 300, which may function respectively as a write transistor and a storage unit in the pixel circuit of CMOS image sensor, and preferably, their positions partially overlap the MOSFET 105 below in a direction vertical to the substrate.

In the embodiment of present invention, similarly, OSFET 301 is provided with structures like gate $G_2$, source $S_2$ and drain $D_2$, wherein gate $G_2$ itself may be a word line, or alternatively, it may be connected with a word line through via. Source $S_2$ and drain $D_2$ are respectively at two sides of the gate $G_2$ and connected to the BEOL metal layer $M_n$ below in the BEOL interconnect layer 200, or in other embodiment, they are parts of BEOL metal layer $M_n$ themselves or may be connected to other BEOL metal layer, ex. a bit line, through vias. The material of gate $G_2$ of the OSFET 301 may be a conductive layer, such as metal layer made of Cu, Al, Mo, Cr, Ti, W or Ta. Alternatively, the material may be nitride of the aforementioned metal elements, such as titanium nitride, molybdenum nitride, tungsten nitride and so on. Still alternatively, the material may be conductive metal oxide like $In_2O_3$, $SnO_2$, ZnO, $In_2O_3$—$SnO_2$, etc. In the embodiment of present invention, the OSFET 301 is provided with channel layer 302 made of oxide-semiconductor material like $GaO_x$, $Ga_2Zn_xO_y$, or indium gallium zinc oxide (IGZO), especially c-axis aligned crystalline IGZO (CAAC-IGZO) having high carrier mobility and low leakage. Agate insulating layer 304 is provided between the channel layer 302 and gate $G_2$, with material like silicon oxide, silicon nitride, silicon oxynitride, or high-k material like hafnium oxide. In the embodiment of present invention, OSFET 301 functions as a write transistor, especially in a condition using IGZO as channel material, its excellent linearity and ultra-low leakage (<1 nA/cell) is very suitable as write transistor to control multi-level storage states of analog memory in the application of in-memory computing. Different from conventional approaches that using doped silicon as semiconductor channel, the property of low-temperature process (<400° C.) of the metal oxide also make enable it to be manufactured in 3D monolithic architecture in a level of semiconductor BEOL process that high-temperature, high thermal budget process can't be performed, without using complicated package skills like heterojunction technology to fulfill 3D wafer-level stacking and integration.

On the other hand, in the embodiment of present invention, FEMIM capacitor 303 is ferroelectric metal-insulator-metal capacitor, which includes a top electrode 307, a bottom electrode 309 and a capacitive dielectric layer 311 set between the top electrode 307 and bottom electrode 309. In the embodiment of present invention, the bottom electrode 309 may be electrically connected to underlying BEOL metal layer $M_n$ through vias. Top electrode 307 may be a part of the top metal layer in the pixel circuit layer 300. The material of top electrode 307 and bottom electrode 309 may be metal like Cu, Al, Mo, Cr, Ti, W, Ta, etc. Alternatively, its material may be nitride of the aforementioned metal elements, such as titanium nitride, molybdenum nitride or tungsten nitride. The material of capacitive dielectric layer 311 may be monolayer or multilayer structure made of ferroelectric material, such as lead zirconium titanate (PZT), hafnium zirconium oxide (HZO), barium titanate ($BaTiO_3$), lead titanate ($PbTiO_3$), and $HfO_2$ doped with elements like N, Si, Al, Y or Sr, preferably HZO, which may provide extremely high capacitance required in the application of in-memory computing and multi-level storage states required by analog memory.

Please note that in the embodiment of present invention, the OSFET 301 and FEMIM capacitor 303 in pixel circuit layer 300 is a part of 3D monolithic architecture directly formed on the BEOL interconnect layer 200 in semiconductor BEOL process, which may be considered as a part of the BEOL interconnect layer 200. As shown in the FIGURE, similarly, pixel circuit layer 300 uses inter-metal dielectric layers IMD as medium, and metal interconnects 305 are also formed therein to connect devices like OSFETs 301 and FEMIM capacitors 303 and to connect with external circuits or devices.

In conventional approach of 3D CMOS image sensor architecture, especially for those CMOS sensors using DRAM as storage units, components like memory, pixel circuit and logic circuit are all manufactured respectively on different substrates and then bonded together through 3D wafer-level stacking and integration. Components like through-silicon via (TSV) and/or silicon interposer are used in 3D package process to create connection between different heterogeneous substrates and functional circuits. Although this complicated package approach can manufacture 3D CMOS image sensor with significantly reduced layout area, its disadvantage is that total thickness of sensor device will be too large since multiple heterogeneous substrates are stacked and integrated together, which is not good for the purpose of miniaturization and mobile application of the electronic devices nowadays. Furthermore, manufacturing cost of TSV is very high, and its I/O signal density is nowhere near the one of common BEOL interconnects, which is also a disadvantage for improving the pixel density of sensor. In addition, 3D package process requires precise alignment between layer and layer or between plane to plane in order to make sure the contacts therebetween can be accurately connected. This becomes more difficult to implement as the density of devices or pixels gradually increased.

Accordingly, in contrast to the aforementioned inherent disadvantage of 3D package process, the approach of present invention is to manufacture the pixel circuit and memory required by the CMOS image sensor directly on or in the BEOL interconnect layer without steps of manufacturing TSVs and overlay alignment, so that manufacturing cost and steps can be significantly reduced, and device density can also be greatly increased. In addition, since all of the components are manufactured on a single substrate, the total thickness of manufactured sensor device may be greatly reduced. In addition, in comparison to the conventional design that storage node is set on the substrate surface, building entire FEMIM capacitor in the topmost free space of the BEOL interconnect layer in a form of metal-insulator-metal may provide higher flexibility and degree of freedom for the design of FEMIM capacitor of the present invention, wherein multiple U-shaped or inverted U-shaped cross-sectional profiles may be easily provided in the design to increase capacitor area per layout area and significantly increase capacitance and storage density as Non-Volatile Memory.

In the embodiment of present invention, MOSFET 105 is set on the surface of substrate 101 in CMOS front-end-of-line (FEOL) process, OSFET 301 is set in or on the BEOL interconnect layer 200 in CMOS BEOL process, FEMIM capacitor 303 is set on the topmost of the BEOL interconnect layer 200, and these three components preferably overlap each other. The advantage of this architecture and order is that it may be compatible with CMOS process and may provide better control for the total thermal budget of the devices, and achieves the effects required by the 3D monolithic architecture, like increasing device integration and storage density, reducing power consumption, integrating multifunctional circuits and reducing manufacturing cost.

Refer still to FIG. 1. A photoelectric conversion layer 400 is set on the pixel circuit layer 300, wherein multiple photodiodes 401 separated by inter-pixel blocks 403 are provided therein. In the embodiment of present invention, the photoelectric conversion layer 400 may be formed directly on the pixel circuit layer 300 to serve as a part of the 3D monolithic architecture. The material of photodiode 401 may be N-type semiconductor layer/P-type semiconductor layer, such as PN junction or PIN structure, which may induce electrical energy when exposed in luminous environment. The amount of induced electrons is proportional to the amount of light falling on the pixel unit. These electrons will be converted to the form of voltage signal in the pixel and may be further converted to analog signal or digital signal. Structures like micro pillars or anti-reflection layer may be further formed on the photodiode 401 to significantly increase amount of light and quantum efficiency of the photodiode. Inter-pixel block 403 may be deep trench isolation, which is made of dielectric material like silicon oxide, silicon nitride or metal oxide. Inter-pixel block 403 may define pixel units of the image sensor and functions as a blocking wall between the pixel units to prevent photons and electrons in the pixel from entering adjacent pixels and causing problems like color mixing or noise.

Refer still to FIG. 1. Structures like color filter 405 and micro lens 407 may be formed sequentially on the photoelectric conversion layer 400. With respect to pixels, the colors of color filter 405 may be different, for example three different colors of red, green and blue (RGB), or complementary colors like cyan, magenta, yellow and green (CMYG), which may be formed on the substrate through spin-coating light-sensitive resins having pigments or dyes on the substrate. Metal-based mask film (not shown) may be further formed between pixels in the color filter 405. Each micro lens 407 would correspond to a pixel unit of CMOS image sensor, which may be made of resin-based material like styrene, acrylic acid and siloxane. Incident light may be focused on corresponding pixels by micro lens 407 and be conducted into corresponding photodiodes 401.

In actual implementation, take 2T1C AI CIS (artificial intelligence CMOS image sensor) as an example, image light entering from the micro lens 407 will be filtered by the color filter 405 to produce lights of different primary colors, and the received color image may be rendered by mixing the lights with different primary colors in different intensity ratios. The filtered primary light will produce photoelectric current (i.e. electric signal converted from optical signal) through the corresponding photodiode 401 due to photoelectric effect. Primary light with different intensities may correspondingly produce photoelectric currents with different amounts. The produced photoelectric current is connected to the source $S_2$ of OSFET 301 through metal interconnects 305. The gate $G_2$ of OSFET 301 may control channel switch to decide if the received optical signal is written into the FEMIM capacitor 303. The optical signal to be written will be connected to bottom electrode 309 of the FEMIM capacitor 303 from the drain $D_2$ of OSFET 301 through metal interconnects in the condition that gate is opened. The conducting photoelectric current will produce a write voltage at floating node of the FEMIM capacitor 303 and make the floating node in one of analog storage states, so that the write operation is completed. In the embodiment of present invention, since the OSFET 301 is inherently provided with extremely low off-state leakage (<1 nA/cell), the voltage at floating node may be well maintained, thus this design is suitable in the application of multi-level analog storage states that are distinguished through subtle voltage differences.

In read operation, gate $G_2$ of the OSFET 301 would close the channel, and a voltage is applied from the upper electrode 307 of FEMIM capacitor 303 to change the voltage at floating node. At the same time, the source $S_1$ of MOSFET 105 (functions as a read transistor) is applied with an output voltage to produce an output current flowing to ground terminal through the channel of opened MOSFET 105 and drain $D_1$. In this read operation, intensity of output current is affected by the opening degree of the gate $G_1$ of MOSFET 105, that is, affected by the floating voltage at floating node. Accordingly, in the condition that input voltage is constant, the original write voltage may decide and control the value of output current, and therefore, the analog storage state of floating node may be obtained by reading the value of output current, to complete the actions of analog-to-digital conversion (ADC) and the read operation, thereby acquiring the optical information of corresponding pixels.

In the embodiment of present invention, since OSFET 301 has excellent linearity and ultra-low leakage, it may ideally control the floating voltage at floating node in the range corresponding to the floating voltage of written optical signal when functions as a write transistor in the aforementioned write operation, thus it is very suitable for the application of AI in-memory computing with multi-level storage states, like performing edge AI computing, analysis and processing for the image signal received by AI CMOS image sensors. For example, the received optical signal is converted to corresponding analog signal through digital-to-analog converter (DAC), and the analog signal is weighted by the write voltage applied through the OSFET 301 to control and perform in-memory computing directly in the AI memory. The resulted analog signal after computing is then converted back to corresponding digital signal through analog-to-digital converter (ADC) for outputting purpose, so as to complete the in-memory, multi-level, analog storage and computing.

Please note that the aforementioned 2T1C AI CMOS image sensor is just one embodiment of the present invention. In actual implementation, different read and write architectures may be designed in response to various requirements and applications of the AI CMOS image sensor. The spirit of present invention is using OSFETs and FEMIM capacitors to fulfill relevant memory functions, thus all of involved and corresponding combinations should all be encompassed within the scope of the present disclosure.

In summary of the embodiments above, the CMOS image sensor provided by the present invention adopts 3D monolithic method to manufacture all components of AI CMOS image sensor on a single wafer without using conventional skill like heterojunction method to integrate circuits, thereby significantly reducing the thickness of product and reducing steps and complexity of relevant process. In addition, steps like die alignment and manufacturing TSVs are unnecessary in the process, so that reliability of product and I/O signal density may be significantly improved. On the other hand, the present invention adopts OSFET and FEMIM capacitor respectively as pixel array circuit and memory of the AI CMOS image sensor, wherein their thin-film and low-temperature properties enable them to be manufactured on BEOL metal layers of the CMOS image sensor directly through CMOS-compatible processes during or after semiconductor BEOL process, thereby perfectly integrating to the original circuit architecture of CMOS image sensor. Properties like high capacitance and analog storage of the FEMIM capacitors make them suitable for advanced applications like AI near-memory computing or in-memory computing required by AI CMOS image sensor, thus high power consumption resulted from image data repeatedly transmitted and refreshed between computing unit and memory may also be significantly reduced, which are the features and advantages of the present invention.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A CMOS image sensor with 3D monolithic OSFET and FEMIM capacitor, comprising:

only one substrate with CMOS field effect transistors formed thereon;

a BEOL interconnect layer on said substrate, and BEOL interconnects are formed in said BEOL interconnect layer;

a pixel circuit layer in said BEOL interconnect layer, wherein OSFETs and FEMIM capacitors are formed in said pixel circuit layer, and said OSFET is provided with a channel layer made of oxide-semiconductor material; and a photoelectric conversion layer on said pixel circuit layer, wherein photodiodes are provided in said photoelectric conversion layer;

wherein said CMOS field effect transistors, said OSFETs, said FEMIM capacitors and said photodiodes are electrically connected with each other through said BEOL interconnect layer.

2. The CMOS image sensor with 3D Monolithic OSFET and FEMIM of claim 1, wherein said OSFET functions as a write transistor to control a writing action of image signal, said FEMIM capacitor is used to store image signal, and said CMOS field effect transistor functions as a read transistor to read image signal stored in said FEMIM capacitor.

3. The CMOS image sensor with 3D Monolithic OSFET and FEMIM of claim 1, wherein said CMOS image sensor is an AI CMOS image sensor, and said OSFETs function as a pixel transistor array and said FEMIM capacitors are used for in-memory computing, and said CMOS field effect transistors function as transistors in analog-to-digital conversion logic circuit.

4. The CMOS image sensor with 3D Monolithic OSFET and FEMIM of claim 1, further comprising color filters and micro lens on said photoelectric conversion layer.

* * * * *